(12) United States Patent
Bulatowicz

(10) Patent No.: US 9,062,973 B2
(45) Date of Patent: Jun. 23, 2015

(54) ATOM BEAM GYROSCOPE

(75) Inventor: Michael D. Bulatowicz, Canoga Park, CA (US)

(73) Assignee: NORTHROP GRUMMAN GUIDANCE AND ELECTRONICS COMPANY, INC., Woodland Hills, CA (US)

( * ) Notice: Subject to any disclaimer, the term of this patent is extended or adjusted under 35 U.S.C. 154(b) by 1180 days.

(21) Appl. No.: 13/017,660

(22) Filed: Jan. 31, 2011

(65) Prior Publication Data
US 2015/0015251 A1 Jan. 15, 2015

(51) Int. Cl.
G01V 3/00 (2006.01)
G01C 19/62 (2006.01)
G01C 19/58 (2006.01)
G01R 33/26 (2006.01)

(52) U.S. Cl.
CPC ............... *G01C 19/62* (2013.01); *G01C 19/58* (2013.01); *G01R 33/26* (2013.01)

(58) Field of Classification Search
CPC ............. G01C 19/58; G01V 3/00; G04F 5/14
See application file for complete search history.

(56) References Cited

U.S. PATENT DOCUMENTS

| 4,157,495 A | 6/1979 | Grover et al. |
| 4,430,616 A * | 2/1984 | Grover .......................... 324/304 |
| 4,992,656 A | 2/1991 | Clauser |
| 5,274,232 A | 12/1993 | Chu et al. |
| 6,009,111 A | 12/1999 | Corwin et al. |
| 6,635,867 B2 | 10/2003 | Kajita |
| 7,965,148 B2 * | 6/2011 | Larsen .......................... 331/94.1 |
| 2007/0266784 A1 | 11/2007 | Lust et al. |
| 2008/0046214 A1 | 2/2008 | Fowler |
| 2008/0278710 A1 | 11/2008 | Schmidt et al. |
| 2009/0309668 A1 | 12/2009 | Bulatowicz et al. |
| 2010/0007345 A1 | 1/2010 | Kanegsberg |

OTHER PUBLICATIONS

International Search Report for corresponding PPCT/US2012/21432, completed May 14, 2012 by Lee W. Young of the ISA/US.
Larsen, U.S. Appl. No. 12/534,615, filed Aug. 3, 2009 entitled: "*Atomic Frequency Clock Systems and Methods*".

* cited by examiner

*Primary Examiner* — Minh N Tang
(74) *Attorney, Agent, or Firm* — Tarolli, Sundheim, Covell & Tummino LLP

(57) ABSTRACT

One embodiment of the invention includes an atom beam gyroscope system. The system includes an atom beam system that generates an atom beam comprising alkali metal atoms along a length of a detection region orthogonal to a sensitive axis. The system also includes a detection system comprising a detection laser and photodetector. The detection laser can generate an optical detection beam that illuminates the detection region to pump the alkali metal atoms. The photodetector can measure an optical absorption of the optical detection beam by the alkali metal atoms in the atom beam and to generate an intensity signal associated with the measured optical absorption. The system further includes a gyroscope sensor configured to calculate rotation of the atom beam gyroscope system about the sensitive axis based on a magnitude of the intensity signal due to a Doppler-shift in energy of the alkali metal atoms in the atom beam.

20 Claims, 4 Drawing Sheets

ATOM BEAM GYROSCOPE

TECHNICAL FIELD

The present invention relates generally to gyroscope systems, and specifically to an atom beam gyroscope.

BACKGROUND

Gyroscopes can be implemented in a variety of applications, such as for navigation and/or guidance systems for aircraft and/or spacecraft. One type of gyroscope is a nuclear magnetic resonance (NMR) gyroscope that operates on the principle of sensing inertial angular rotation rate or angle about a sensitive axis based on a shift in the Larmor precession frequency or phase of one or two isotopes that possess nuclear magnetic moments. As an example, an NMR gyroscope cell can contain one or more alkali metal vapors, such as Rubidium, together with one or two gyromagnetic isotopes that are caused to process in response to a magnetic field. As a result, the Larmor precession frequency and phase information of the one or two gyromagnetic isotopes can be extracted to calculate a rotation frequency about the sensitive axis based on the extracted Larmor precession frequencies and phase information.

Another type of gyroscope can be an interferometer that can be used as an inertial sensor. As an example, the interferometer can include matter-wave propagation beam paths enclosing a finite area that senses rotations via the Sagnac effect. The matter-wave propagation beam paths can be configured as a single beam of atoms that is split into two beams and guided around two counter-rotating paths by an atomic waveguide. The beams can then be recombined for interferometry to measure rotation rate. Thus, the interferometer can likewise be used as a rotation rate sensor for use in avionics, such as for an aircraft or spacecraft.

SUMMARY

One embodiment of the invention includes an atom beam gyroscope system. The system includes an atom beam system configured to generate an atom beam comprising alkali metal atoms along a length of a detection region orthogonal to a sensitive axis. The system also includes a detection system comprising a detection laser and a photodetector. The detection laser can be configured to generate an optical detection beam that illuminates the detection region to pump the alkali metal atoms. The photodetector can be configured to measure an optical absorption of the optical detection beam by the alkali metal atoms in the atom beam and to generate an intensity signal associated with the measured optical absorption. The system further includes a gyroscope sensor configured to calculate rotation of the atom beam gyroscope system about the sensitive axis based on a magnitude of the intensity signal due to a Doppler-shift in energy of the alkali metal atoms in the atom beam.

Another embodiment of the invention includes a method for calculating a rotation angle about a sensitive axis. The method comprises generating an atom beam comprising alkali metal atoms along a length of a detection region orthogonal to the sensitive axis and generating an optical detection beam having a first wavelength that is offset by a predetermined amount from a second wavelength corresponding to an absorption probability peak of photons by the alkali metal atoms in the atom beam having a substantially zero axial velocity with respect to the optical detection beam. The method also comprises illuminating the detection region via the optical detection beam to pump the alkali metal atoms and measuring an optical absorption of the optical detection beam by the alkali metal atoms in the atom beam. The method also comprises generating an intensity signal associated with the measured absorption of the optical detection beam and calculating the rotation angle about the sensitive axis based on a magnitude of the intensity signal due to a Doppler-shift in energy of the alkali metal atoms in the atom beam.

Another embodiment of the invention includes an atom beam gyroscope system. The system comprises an atom beam system configured to generate a first atom beam along a length of a first detection region and a second atom beam along a length of a second detection region. The first and second atom beams comprise alkali metal atoms propagating orthogonal to the sensitive axis and in opposite directions relative to each other. The system also comprises a detection system comprising a first detection laser, a second detection laser, a first photodetector, and a second photodetector. The first detection laser can be configured to generate a first optical detection beam that illuminates the first detection region to pump the alkali metal atoms. The second detection laser can be configured to generate a second optical detection beam that illuminates the second detection region to pump the alkali metal atoms. The first photodetector can be configured to measure an intensity of the first optical detection beam exiting the first detection region and to generate a first intensity signal associated with the measured intensity. The second photodetector can be configured to measure an intensity of the second optical detection beam exiting the second detection region and to generate a second intensity signal associated with the measured intensity. The system also comprises a gyroscope sensor configured to calculate rotation and linear acceleration of the atom beam gyroscope system about the sensitive axis based on a magnitude of the first and second intensity signals due to a Doppler-shift in energy of the alkali metal atoms in the atom beam.

DETAILED DESCRIPTION

The present invention relates generally to gyroscope systems, and specifically to an atom beam gyroscope. The atom beam gyroscope system can include an atom beam source that generates one or two atom beams that comprise alkali metal atoms that are emitted from the atom beam source in a direction that is orthogonal relative to a sensitive axis of the atom beam gyroscope system. As an example, the atom beam source can be configured as an evaporated alkali metal beam cell, or can be configured as a two- or three-dimensional magneto-optical trap. The atom beam gyroscope system can also include a detection system that includes at least one detection laser and a photodetector. As an example, the detection laser can generate a detection beam that is circularly-polarized and propagates in a direction orthogonal to both the atom beam gyroscope sensitive axis and the atom beam. A magnetic field generator can be configured to generate a magnetic field gradient that increases from a nominal axis of the atom beam, such that the magnetic field gradient and the circularly-polarized detection beam can substantially adjust a probability of absorption of photons of the detection beam by alkali metal atoms having a non-zero velocity relative to the detection beam due to the Zeeman effect. Therefore, an amount of Doppler-shift of the atom beam resulting from rotation of the gyroscope system about the sensitive axis can be detected by the photodetector, thus allowing the rotation of the gyroscope system to be calculated.

Figure 1:
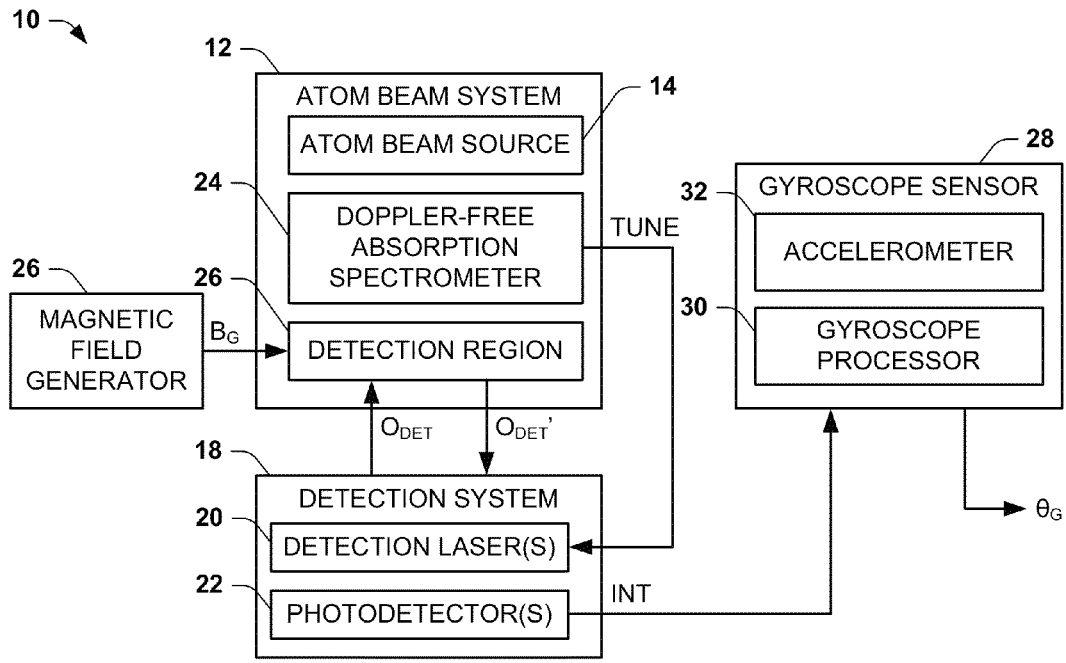
FIG. 1 illustrates an example of an atom beam gyroscope system in accordance with an aspect of the invention.

FIG. 1 illustrates an example of a diagram of an atom beam gyroscope system 10 in accordance with an aspect of the invention. As an example, the atom beam gyroscope system 10 can be implemented in navigation or any of a variety of avionic applications, including aircraft and/or spacecraft. The atom beam gyroscope system 10 is configured to calculate a rotation angle $\theta_G$ of the atom beam gyroscope system 10 about a sensitive axis based on changes in measured optical energy absorption of alkali metal atoms in an atom beam resulting from a Doppler-shift in energy between absorbed photons and the alkali metal atoms due to an angular velocity of the alkali metal atoms.

The atom beam gyroscope system 10 includes an atom beam system 12. The atom beam system 12 includes an atom beam source 14 that is configured to generate an atom beam comprising collimated alkali metal atoms. As an example, the alkali metal atoms can be Cesium (Cs) or Rubidium (Rb). For example, the atom beam source 14 can be configured as a magneto-optical trap (MOT), such as a two-dimensional MOT or a three-dimensional MOT based on the configuration of collimating light (not shown), or can be configured as an evaporated alkali metal beam cell.

The atom beam system 12 also includes a detection region 16. The detection region 16 can be configured as an enclosed casing through which the atom beam is directed. For example, the detection region 16 can be arranged to allow the atom beam to be directed orthogonal with respect to a sensitive axis of the atom beam gyroscope system 10. Therefore, the atom beam experiences an angular velocity with respect to the detection region 16 in response to a rotation of the atom beam gyroscope system 10 about the sensitive axis. The dimensions of the detection region 16 can thus be arranged to have sufficient length and width that are optimized based on a velocity and flux of the atom beam to allow the atom beam to be directed from the atom beam source 14 at a proximal end of the detection region 16 past a detection system 18 that is located at a distal end of the detection region 16.

The detection system 18 includes at least one detection laser 20 and a respective at least one photodetector 22. As an example, the detection laser(s) 20 can be configured as any of a variety of types of lasers, such as distributed feedback laser(s) (DFBs) or vertical-cavity surface-emitting laser(s) (VCSELs). The detection laser(s) 20 are thus configured to illuminate the detection region 16 with an optical detection beam $O_{DET}$, such that the optical detection beam $O_{DET}$ is arranged orthogonally with respect to both the atom beam and the sensitive axis, to pump the alkali metal atoms of the atom beam. As a result, the photodetector(s) 22 can be configured to measure an intensity of the optical detection beam exiting the detection region 16, demonstrated in the example of FIG. 1 as $O_{DET}{}^1$, to determine absorption of photons of the optical detection beam by the alkali metal atoms of the atom beam. In the example of FIG. 1, the photodetector(s) 22 are configured to generate an intensity signal INT that corresponds to the intensity of the optical detection beam $O_{DET}{}^1$ exiting the detection region 16.

As an example, the detection laser(s) 20 can be specifically tuned to generate the optical detection beam $O_{DET}$ at a specific wavelength that is optimized for detecting rotation of the atom beam gyroscope system 10 about the sensitive axis. The atom beam system 12 is demonstrated in the example of FIG. 1 as including a Doppler-free absorption spectrometer 24. The Doppler-free absorption spectrometer 24 can be configured as an arrangement of lasers and photodetectors that are implemented to tune the detection laser(s) 20 to a specific and stable wavelength. In the example of FIG. 1, the Doppler-free absorption spectrometer 24 is demonstrated as providing a signal TUNE to the detection laser(s) 20. However, it is to be understood that the detection laser(s) 20 can be configured as optically split from the lasers of the Doppler-free absorption spectrometer 24, such that the optical beams of the Doppler-free absorption spectrometer 24 and the optical detection beam $O_{DET}$ are generated from the same optical source.

Figure 2:
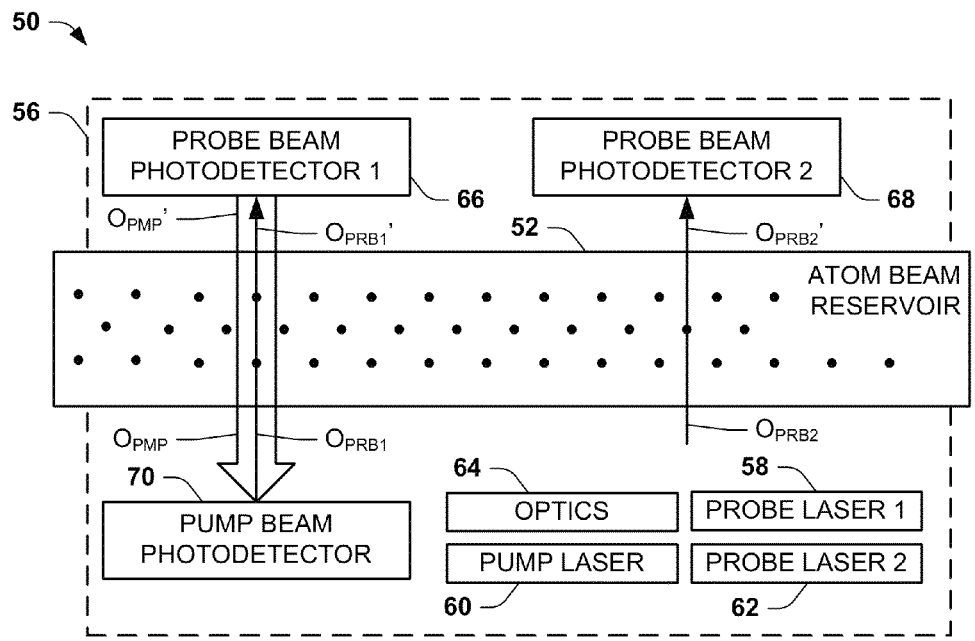
FIG. 2 illustrates an example of a Doppler-free absorption spectrometer system in accordance with an aspect of the invention.

FIG. 2 illustrates an example of a Doppler-free absorption spectrometer system 50 in accordance with an aspect of the invention. The Doppler-free absorption spectrometer system 50 can correspond to the Doppler-free absorption spectrometer system 26 in the example of FIG. 1. Therefore, reference is to be made to the example of FIG. 1 in the following description of the example of FIG. 2.

The Doppler-free absorption spectrometer system 50 includes an atom reservoir 52, which is demonstrated in the example of FIG. 2 as an enclosed region that includes an uncollimated mass of alkali metal atoms 54. As an example, the alkali metal atoms 54 can be one of Cesium (Cs) or Rubidium (Rb). Thus, the atom reservoir 52 can correspond to a portion of the atom beam source 14 in the example of FIG. 1. For example, the atom reservoir 52 can correspond to a portion of an MOT that is not illuminated by collimating light, or can correspond to a reservoir chamber of an evaporated alkali metal beam cell. Therefore, the alkali metal atoms 54 can be moving randomly in substantially all directions within the atom reservoir 52, and thus not yet directed as the atom beam of the atom beam gyroscope system 10.

The Doppler-free absorption spectrometer system 50 also includes a Doppler-free absorption spectrometer 56. The Doppler-free absorption spectrometer 56 is demonstrated as including a first probe laser 58, a second probe laser 60, and a pump laser 62. The first probe laser 58 is configured to generate a first optical probe beam $O_{PRB1}$, the second probe laser 60 is configured to generate a second optical probe beam $O_{PRB2}$, and the pump laser 62 is configured to generate an optical pump beam $O_{PMP}$. A set of optics 64 is configured to direct the first optical probe beam $O_{PRB1}$, the second optical probe beam $O_{PRB2}$, and the optical pump beam $O_{PMP}$ through the atom reservoir 52. The Doppler-free absorption spectrometer system 50 also includes a first probe beam photodetector 66, a second probe beam photodetector 68, and a pump beam photodetector 70. The first probe beam photodetector 66 is configured to monitor an intensity of the first optical probe beam $O_{PRB1}$, the second probe beam photodetector 68 is configured to monitor an intensity of the second optical probe beam $O_{PRB2}$, and the pump beam photodetector 70 is configured to monitor an intensity of the optical pump beam $O_{PMP}$.

In the example of FIG. 2, the first optical probe beam $O_{PRB1}$ is demonstrated as propagating substantially collinear with and in an opposite direction of the optical pump beam $O_{PMP}$. In addition, the second optical probe beam $O_{PRB2}$ is demonstrated as being substantially parallel with and in the opposite direction of the optical pump beam $O_{PMP}$ and being spaced apart from the optical pump beam $O_{PMP}$ within the atom reservoir 52. The first and second optical probe beams $O_{PRB1}$ and $O_{PRB2}$ can have an intensity magnitude that is less than or approximately equal to the intensity magnitude of the optical pump beam $O_{PMP}$. For example, the first and second optical probe beams $O_{PRB1}$ and $O_{PRB2}$ can have an intensity that is approximately 10% of the intensity of the optical pump beam $O_{PMP}$. In the example of FIG. 2, the first and second optical probe beams $O_{PRB1}$ and $O_{PRB2}$ exit the atom reservoir 52 as beams $O_{PRB1}'$ and $O_{PRB2}'$, respectively, and are provided to the first and second probe beam photodetectors 66 and 68. Similarly, the optical pump beam $O_{PMP}$ exits the atom reservoir 52 as a beam $O_{PMP}'$ and is provided to the pump beam photodetector 70.

The Doppler-free absorption spectrometer 56 is thus configured to tune the detection laser(s) 20 in the example of FIG. 1 to a specific and stable wavelength. As an example, both the first and second optical probe beams $O_{PRB1}'$ and $O_{PRB2}'$ exiting the atom reservoir 52 can provide a Doppler-broadened absorption signal associated with the alkali metal atoms 54. However, the first optical probe beam $O_{PRB1}'$ also provides a non-linear saturated absorption spectroscopy signal within the Doppler-broadened absorption signal based on propagating substantially collinearly with and opposite the optical pump beam $O_{PMP}$. Specifically, the optical pump beam $O_{PMP}$ pumps a relatively large number of the alkali metal atoms 54 out of the atomic states that can absorb photons from the first optical probe beam $O_{PRB1}$ based on the optical pump beam $O_{PMP}$ having a higher optical power relative to the first optical probe beam $O_{PRB1}$. Therefore, at the wavelength that the alkali metal atoms 54 would absorb photons of the first optical probe beam $O_{PRB1}$, there is a reduction in the absorption of the photons of the first optical probe beam $O_{PRB1}$ relative to the absorption of the photons of the second optical probe beam $O_{PRB2}$.

As a result, a difference in the intensity of the first and second optical probe beams $O_{PRB1}'$ and $O_{PRB2}'$ exiting the atom reservoir 52, as measured by the probe beam photodetectors 66 and 68, can substantially eliminate the Doppler-broadening effect of the alkali metal atoms 54. Therefore, the Doppler-free absorption spectrometer 56 can detect a fundamental linewidth frequency of the alkali metal atoms 54 associated with a peak of an absorption spectrum of the alkali metal atoms 54 having a substantially zero axial velocity with respect to the optical probe beams $O_{PRB1}$ and $O_{PRB2}$ and the optical pump beam $O_{PMP}$. As described herein, all reference to an absorption spectrum of alkali metal atoms, including the alkali metal atoms 54 and the alkali metal atoms in the atom beam, is with respect to an absorption spectrum of alkali metal atoms having substantially zero axial velocity with respect to pumping light, including the optical probe beams $O_{PRB1}$ and $O_{PRB2}$ and the optical pump beam $O_{PMP}$, as well as the optical detection beam(s) $O_{DET}$, respectively.

Accordingly, because the fundamental linewidth frequency of the alkali metal atoms 54 is substantially independent of temperature and does not drift over time, the detection laser(s) 20 can be substantially locked to a wavelength that is determined by the Doppler-free absorption spectrometer 56. As an example, the first and second probe lasers 58 and 60, the pump laser 62, and the detection laser(s) 20 can all be associated with the same optical source. Thus, the detection laser(s) 20 can be substantially locked to the same substantially stable wavelength that the first and second probe lasers 58 and 60 and the pump laser 62 are locked based on the operation of the Doppler-free absorption spectrometer 56. For example, the detection laser(s) 20 can be substantially locked to the absorption peak (i.e., the fundamental linewidth frequency) itself, or can be locked to a frequency that is substantially offset from the absorption peak by a predetermined amount based on the operation of the Doppler-free absorption spectrometer 56. For example, the wavelength of the first and second probe lasers 58 and 60, the pump laser 62, and the detection laser(s) 20 can all be substantially locked to a wavelength corresponding to a point on the absorption spectrum of the zero axial velocity alkali metal atoms 54 having a highest absolute value slope.

Referring back to the example of FIG. 1, the atom beam gyroscope system 10 also includes a magnetic field generator 26 that is configured to generate a magnetic field gradient $B_G$ at the detection region 16. The magnetic field gradient $B_G$ can have increasing magnetic field intensity off-axis with respect to the axis of the atom beam. Thus, the magnetic field gradient $B_G$, coupled with characteristics of the optical detection beam $O_{DET}$, can be implemented to substantially adjust absorption parameters of the atom beam. As an example, the optical detection beam(s) $O_{DET}$ can be circularly-polarized, such as generated from the detection laser(s) 20 or based on the use of a polarizer (not shown). The orientation of the circular-polarization (e.g., right-handed or left-handed) can be selected relative to the magnetic field gradient $B_G$ to take advantage of a Zeeman-shift in relative energy between the photons of the optical detection beam(s) $O_{DET}$ and the alkali metal atoms of the atom beam. Therefore, the magnetic field gradient $B_G$ and the circular-polarization of the optical detection beam(s) $O_{DET}$ can facilitate substantially greater or lesser absorption of photons of the optical detection beam(s) $O_{DET}$ by the alkali metal atoms of the atom beam depending on an off-axis location of the alkali metal atoms from the nominal path of the atom beam due to the Zeeman effect. As a result, the magnitude of the intensity signal INT can indicate a relative absorption of the photons of the optical detection beam(s) $O_{DET}$ by the alkali metal atoms in the atom beam that corresponds to an axial velocity, and thus an axial location, of the alkali metal atoms relative to the optical detection beam(s) $O_{DET}$ based on the Zeeman-shift and a Doppler-shift of the alkali metal atoms relative to the photons of the optical detection beam(s) $O_{DET}$. Accordingly, the Zeeman- and Doppler-shifts of the alkali metal atoms coupled with the optical detection beam(s) $O_{DET}$ having a wavelength tuned to a location on the optical absorption spectrum for substantially zero axial velocity alkali metal atoms, as described above, ensures that very slight deviations of the alkali metal atoms from the nominal beam path of the atom beam result in significant changes in the magnitude of the intensity signal INT.

The atom beam gyroscope system 10 further includes a gyroscope sensor 28. The gyroscope sensor 28 includes a gyroscope processor 30 that is configured to determine an angular velocity of the rotation of the atom beam gyroscope system 10 about the sensitive axis, and thus a rotation angle $\theta_G$ of the atom beam gyroscope system 10, based on the magnitude of the intensity signal INT. As an example, the gyroscope processor 30 can be programmed to identify a correlation between the magnitude of the intensity signal INT and an axial location of the alkali metal atoms of the atom beam relative to the optical detection beam(s) $O_{DET}$, and thus the nominal beam path of the atom beam. Therefore, as the alkali metal atoms deviate from the nominal beam path of the atom beam in the detection region 16 in response to rotation of the atom beam gyroscope system 10 about the sensitive axis, the gyroscope processor 30 can determine the angular velocity of the alkali metal atoms in the beam path based on the changes in the intensity signal INT corresponding to relative axial locations of the alkali metal atoms from the nominal beam path of the atom beam. Accordingly, the gyroscope processor 30 can translate the determined angular velocity of the alkali metal atoms in the atom beam to the rotation angle $\theta_G$ of the atom beam gyroscope system 10 about the sensitive axis.

Figure 3:
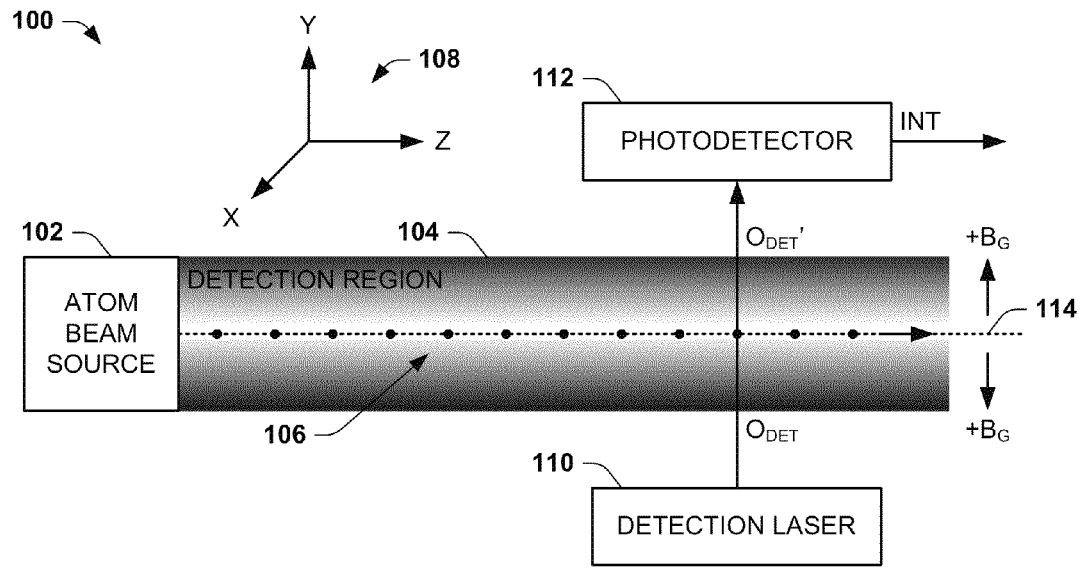
FIG. 3 illustrates another example of an atom beam gyroscope system in accordance with an aspect of the invention.

FIG. 3 illustrates another example of an atom beam gyroscope system 100 in accordance with an aspect of the invention. The atom beam gyroscope system 100 can correspond to a portion of the atom beam gyroscope 10 in the example of FIG. 1 (e.g., the atom beam system 12 and the detection system 18). Therefore, reference is to be made to the atom beam gyroscope system 10 in the example of FIG. 1 in the following description of the example of FIG. 3.

The atom beam gyroscope system 100 includes an atom beam source 102 and a detection region 104. The atom beam source 102 can be configured as a two- or three-dimensional MOT or an evaporated alkali metal beam cell. The atom beam source 102 thus generates an atom beam 106 in a beam path in the detection region 104 along a +Z-axis direction, as indicated by the Cartesian coordinate system indicated at 108. Thus, at substantially no rotation of the atom beam gyroscope system 100 about the X-axis (i.e., the sensitive axis in the example of FIG. 3), the atom beam 106 is directed along the Z-axis with substantially no component of velocity in the +/−Y-axis direction. It is to be understood that the atom beam gyroscope system 100, and thus the atom beam system 10 in the example of FIG. 1, can be tuned to substantially account for the effect of external forces, such as gravity, on the atom beam 106. In addition, it is also to be understood that the sensitive axis can intersect a location of the atom beam gyroscope system 100 at a location that is approximately at or near the atom beam source 102 to affect the angular velocity of the alkali metal atoms in the atom beam 106 substantially equally in response to rotation about the sensitive axis in either direction.

The atom beam gyroscope system 100 also includes a detection laser 110 and a photodetector 112. The detection laser 110 is configured to generate the optical detection beam $O_{DET}$ that is directed substantially in the +Y direction, and thus orthogonal to both a nominal beam path of the atom beam 106, indicated at 114, and the sensitive axis of the atom beam gyroscope system 100. The optical detection beam $O_{DET}$ can be circularly-polarized and can be tuned to a wavelength that is offset from the peak of the optical absorption spectrum of the alkali metal atoms of the atom beam 106, such as at a greatest absolute-value slope of the peak. The photodetector 112 is configured to measure an intensity of the optical detection beam $O_{DET}'$ exiting the detection region 104. The photodetector 112 can thus generate the intensity signal INT that has a magnitude based on the intensity of the optical detection beam $O_{DET}'$ exiting the detection region 104. Accordingly, the magnitude of the intensity signal INT corresponds to an amount of absorption of the photons of the optical detection beam $O_{DET}$ by the alkali metal atoms of the atom beam 106.

It is to be understood that the measurement of the intensity of the optical detection beam $O_{DET}'$ exiting the detection region 104 via the photodetector 112 is but one example of measuring the absorption of photons of the optical detection beam $O_{DET}$ by the alkali metal atoms of the atom beam 106. As another example, the atom beam gyroscope system 10 in the example of FIG. 1, and thus the atom beam gyroscope system 100 in the example of FIG. 3, can implement fluorescence detection that measures light emission from the alkali metal atoms of the atom beam 106. As an example, the atom beam gyroscope system 100 can instead be configured to include at least the photodetector 112 out of the path of the optical detection beam $O_{DET}$, such that the photodetector 112 is configured to measure photons emitted from the alkali metal atoms after having been pumped by the optical detection beam $O_{DET}$. Because the photons emitted from the alkali metal atoms is substantially equal to the photons absorbed by the alkali metal, the photodetector 112 in a fluorescence detection arrangement of the atom beam gyroscope system 100 can similarly be configured to measure the absorption of photons of the optical detection beam $O_{DET}$ by the alkali metal atoms of the atom beam 106.

In addition, as demonstrated in the example of FIG. 3, a magnetic field gradient $B_G$ is applied to the detection region 104. As an example, the magnetic field gradient $B_G$ can be generated by the magnetic field generator 26 in the example of FIG. 1. The magnetic field gradient $B_G$ is demonstrated as having an intensity of approximately zero along the nominal beam path 114 of the atom beam 106, with increasing intensity in the +/−Y-axis directions off-axis of the nominal beam path 114. It is to be understood that the magnetic field gradient $B_G$ could also increase in the +/−X-axis directions, as well. As a result, as the alkali metal atoms of the atom beam 106 deviate off-axis from the nominal beam path 114 of the atom beam 106, the alkali metal atoms experience a change in potential energy due to an interaction between local magnetic fields resulting from electron spin and the intensity of the magnetic field gradient $B_G$ based on the Zeeman effect. Accordingly, the change in potential energy of the alkali metal atoms that deviate off-axis from the nominal beam path 114 can result in a change in the absorption of photons of the optical detection beam $O_{DET}$ by the alkali metal atoms based on the axial location of the alkali metal atoms relative to the nominal beam path 114. For example, the optical detection beam $O_{DET}$ can be circularly-polarized with an orientation (e.g., right- or left-handed) to substantially increase the probability of absorption of photons for alkali metal atoms in the −Y axis relative to the nominal beam path 114 and substantially decrease the probability of absorption of photons for alkali metal atoms in the +Y axis relative to the nominal beam path 114, as indicated by the magnitude of the intensity signal INT. It is to be understood that the magnetic field gradient $B_G$ can be either a positive or negative gradient, as appropriate for the direction of circular polarization of the optical detection beam $O_{DET}$.

In addition, as described above, the optical detection laser 110 can be tuned to generate the optical detection beam $O_{DET}$ at a wavelength that corresponds to a greatest absolute value slope of the absorption spectrum of the alkali metal atoms along the nominal beam path 114. As an example, the optical detection beam $O_{DET}$ can have a wavelength that substantially increases the probability of absorption of photons by alkali metal atoms in the −Y axis relative to the nominal beam path 114 and substantially decrease the probability of absorption of photons for alkali metal atoms in the +Y axis relative to the nominal beam path 114 based on a Doppler-shift of the energy of the alkali metal atoms relative to the optical detection beam $O_{DET}$, as indicated by the magnitude of the intensity signal INT. Therefore, when combined with the Zeeman-shift effects based on the magnetic field gradient $B_G$ described above, very small deviations in the location of the alkali metal atoms relative to the nominal beam path, such as based on rotation of the atom beam gyroscope system 100 about the sensitive axis, can result in measurable changes in the magnitude of the intensity signal INT. Accordingly, the gyroscope processor 30 in the example of FIG. 1 can accurately calculate the rotation angle $\theta_G$ of the atom beam gyroscope system 100 about the sensitive axis.

Referring back to the example of FIG. 1, the atom beam system 12 and the detection system 18 can be configured substantially similar to the atom beam system 100 in the example of FIG. 3, such that the atom beam source 14 generates a single atom beam. Thus, the atom beam gyroscope system 10 can be configured to calculate the rotation angle $\theta_G$ about the sensitive axis based on the motion of the alkali metal atoms relative to the nominal beam path of the atom beam. However, such motion of the alkali metal atoms relative to the nominal beam path of the atom beam can also result from a linear acceleration of the atom beam gyroscope system 10. Thus, the gyroscope processor 30 may not be able to differentiate between rotation and linear acceleration of the atom beam gyroscope system 10 based solely on axial velocity of the alkali metal atoms relative to the optical detection beam(s) $O_{DET}$.

In the example of FIG. 1, the gyroscope sensor 28 includes an accelerometer 32 configured to detect and/or calculate a linear acceleration of the atom beam gyroscope system 10. The accelerometer 32 can provide the linear acceleration information to the gyroscope processor 30, such that the gyroscope processor 30 can substantially cancel the linear acceleration of the atom beam gyroscope system 10 from the calculation the rotation angle $\theta_G$ of the atom beam gyroscope system 10 about the sensitive axis. Accordingly, the gyroscope processor 30 can calculate the rotation angle $\theta_G$ of the atom beam gyroscope system 10 about the sensitive axis based on the magnitude of the intensity signal INT and the linear acceleration of the atom beam gyroscope 10, as measured by the accelerometer 32.

In the above examples of FIGS. 1 and 3, the respective atom beam gyroscope systems 10 and 100 can still be subject to the effects of linear acceleration parallel to the propagation direction of atom beam 106 (i.e., the Z-axis). Specifically, linear acceleration parallel to the direction of the atom beam 106 can change the velocity of the atom beam 106 relative to the gyroscope sensor 28, and thus the linear velocity and displacement of the atoms of the atom beam 106 for a given rotational rate about the sensitive axis. As a result, a gyroscope scale factor sensitivity to acceleration rate along the direction of the atom beam 106 can occur. Thus, the accelerometer 32 can include an accelerometer configured to measure acceleration in the direction of the atom beam 106, such as in +/−Z axis. Accordingly, the measured acceleration in the +/−Z axis can be factored-out from the calculation of the rotation of the atom beam gyroscope system 100 about the sensitive axis.

Alternatively, the gyroscope scale factor sensitivity can be substantially mitigated by controlling a velocity of the atom beam 106, such as at the atom beam source 14. As an example, two counter-propagating properly tuned circularly-polarized optical beams can be directed parallel to the propagation direction of the atom beam 106. The tuning of these two optical beams can be such that the desired atom beam velocity results in a minimum absorption of these optical beams. Thus, any atoms moving faster or slower than this velocity can experience a pushing force that substantially alters their velocity until they match the velocity corresponding to a minimum absorption of these two optical beams. This occurs due to a Doppler-shift effect analogous to the effect used for measurement of the rotation rate of the atom beam gyroscope system 10. Specifically, atoms of the atom beam 106 that are slower or faster than the control velocity can be Doppler-shifted relative to the two velocity control optical beams so as to increase or decrease the probability of absorbing a photon from the detection beam. Proper tuning of the two beams of light can ensure that these changes in absorption probability can result in a net force altering the velocities of the atoms such that they more closely match the control velocity. The control velocity can thus essentially eliminate the atom beam velocity sensitivity to linear accelerations parallel to the propagation direction of the atom beam 106.

Figure 4:
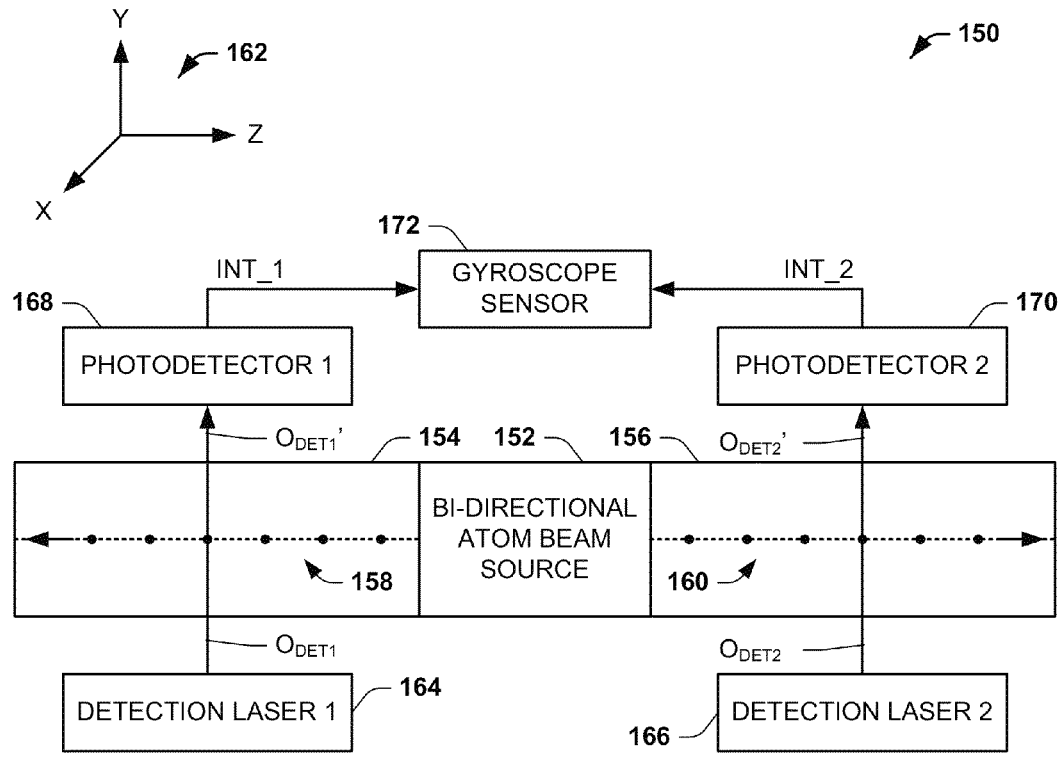
FIG. 4 illustrates yet another example of an atom beam gyroscope system in accordance with an aspect of the invention.

FIG. 4 illustrates yet another example of an atom beam gyroscope system 150 in accordance with an aspect of the invention. The atom beam gyroscope system 150 includes a bi-directional atom beam source 152, a first detection region 154, and a second detection region 156. As an example, the bi-directional atom beam source 152 can be configured as a two-dimensional MOT or can be configured as two separate three-dimensional MOTs or evaporated alkali metal beam cells. Therefore, the bi-directional atom beam source 152 generates a first atom beam 158 in a beam path in the first detection region 154 along a −Z-axis direction and a second atom beam 160 in a beam path in the second detection region 156 along a +Z-axis direction, as indicated by the Cartesian coordinate system indicated at 162. The first and second atom beams 158 and 160 are thus directed in opposite directions with respect to each other. Accordingly, at substantially no rotation of the atom beam gyroscope system 150 about the X-axis (i.e., the sensitive axis in the example of FIG. 4), the first and second atom beams 158 and 160 are directed along the −Z and +Z-axes, respectively, with substantially no component of velocity in the +/−Y-axis direction.

The atom beam gyroscope system 150 also includes a first detection laser 164, a second detection laser 166, a first photodetector 168, and a second photodetector 170. The first detection laser 164 is configured to generate a first optical detection beam $O_{DET1}$ in the first detection region 154 and the second detection laser 166 is configured to generate a second optical detection beam $O_{DET2}$ in the second detection region 154. Each of the first and second detection beams $O_{DET1}$ and $O_{DET2}$ are directed substantially in the +Y direction, and thus orthogonal to the nominal beam paths of the first and second atom beams 158 and 160 and the sensitive axis of the atom beam gyroscope system 150. It is to be understood that the first and second detection beams $O_{DET1}$ and $O_{DET2}$ need not be directed in the same direction, but could be directed in opposite directions. Similar to as described above regarding the example of FIG. 3, a magnetic field gradient $B_G$ can be applied to the first and second detection regions 154 and 156 and the first and second optical detection beams $O_{DET1}$ and $O_{DET2}$ can each be circularly-polarized. Furthermore, the first and second optical detection beams $O_{DET1}$ and $O_{DET2}$ can be tuned to a wavelength that is offset from the peak of the optical absorption spectrum of the alkali metal atoms of the atom beams 158 and 160, such as at a greatest absolute-value slope of the peak.

The first and second photodetectors 168 and 170 are each configured to measure an intensity of the respective first and second optical detection beams $O_{DET1}'$ and $O_{DET2}'$ exiting the respective detection regions 154 and 156. The first photodetector 168 can thus generate an intensity signal INT_1 that has a magnitude based on the intensity of the first optical detection beam $O_{DET1}'$ exiting the first detection region 154, and the second photodetector 170 can thus generate an intensity signal INT_2 that has a magnitude based on the intensity of the second optical detection beam $O_{DET2}'$ exiting the second detection region 156. Accordingly, the magnitude of the intensity signals INT_1 and INT_2 correspond to an amount of absorption of the photons of the first and second optical detection beams $O_{DET1}$ and $O_{DET2}$ by the alkali metal atoms of the respective atom beams 158 and 160. In the example of FIG. 4, the first and second intensity signals INT_1 and INT_2 are each provided to a gyroscope sensor 172.

Based on the configuration of the atom beam gyroscope system 150, each of the first and second intensity signals INT_1 and INT_2 can be associated with the motion of the alkali metal atoms in the respective first and second atom beams 158 and 160 separately and independently with respect to each other. As a result, the gyroscope sensor 172 can be configured to determine both rotation of the atom beam gyroscope system 150 about the sensitive axis and linear acceleration of the atom beam gyroscope system 150 based on a difference between the magnitudes of the first and second intensity signals INT_1 and INT_2. As an example, rotation about the sensitive axis (i.e., centered about the bi-directional atom beam source 152) in a clockwise direction can result in an axial velocity of the alkali metal atoms in the first atom beam 158 in the −Y direction and an axial velocity of the alkali metal atoms in the second atom beam 160 in the +Y direction. Rotation about the sensitive axis in a counter-clockwise direction can result in an axial velocity of the alkali metal atoms in the first atom beam 158 in the +Y direction and an axial velocity of the alkali metal atoms in the second atom beam 160 in the −Y direction. However, a linear acceleration of the atom beam gyroscope system 150 in the +Y direction can result in an axial velocity of the alkali metal atoms in both the first and second atom beams 158 and 160 in the −Y direction, and in the +Y direction as a result of a linear acceleration in the −Y direction.

Therefore, the gyroscope processor 30 in the example of FIG. 1 can be configured to determine both linear acceleration and rotation about the sensitive axis based on the relative magnitudes of the first and second intensity signals INT_1 and INT_2. Specifically, the gyroscope processor 30 can be configured to factor out the linear acceleration in the Y-axis from the calculation of the rotation angle $\theta_G$ of the atom beam gyroscope system 150 about the sensitive axis. Accordingly, an accelerometer can be omitted from the gyroscope sensor 172 in the example of FIG. 4 with respect to measuring linear acceleration in the Y-axis. However, a linear acceleration in the Z-axis can result in an increase in velocity in one of the atom beams 158 and 160 and a substantially equal decrease in velocity in the other of the atom beams 158 and 160, such that the atom beam gyroscope system 150 can be subject to gyroscope scale factor sensitivity. Therefore, similar to as described above regarding the example of FIG. 3, the atom beam gyroscope system 150 can include an accelerometer or can implement velocity control of the atom beams 158 and 160 to substantially the mitigate gyroscope scale factor sensitivity resulting from linear acceleration in the Z-axis.

Furthermore, it is to be understood that while the atom beam gyroscope systems 100 and 150 in the examples of FIGS. 3 and 4 include a single optical detection beam and photodetector pair for each detection region, the atom beam gyroscope systems 100 and 150 can also include additional optical detection beam and photodetector pairs, such as for redundancy or for calculation of rotation angle about a different sensitive axis. For example, in the example of FIGS. 3 and 4, each of the respective detection regions could also include an optical detection beam and photodetector pair arrange to pump the alkali metal atoms in the +/−X direction, such as to also calculate rotation of the respective atom beam gyroscope systems 100 and 150 about the Y-axis.

Figure 5:
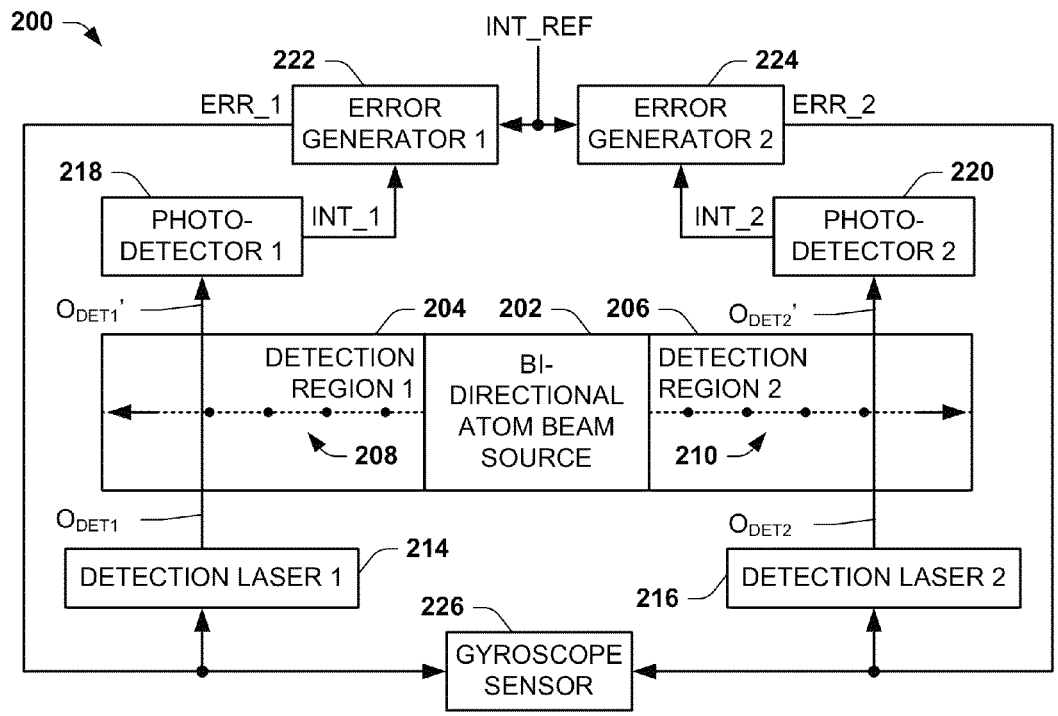
FIG. 5 illustrates yet a further example of an atom beam gyroscope system in accordance with an aspect of the invention.

FIG. 5 illustrates yet a further example of an atom beam gyroscope system 200 in accordance with an aspect of the invention. The atom beam gyroscope system 200 includes a bi-directional atom beam source 202, a first detection region 204, and a second detection region 206. As an example, the bi-directional atom beam source 202 can be configured as a two-dimensional MOT or can be configured as two separate three-dimensional MOTs or evaporated alkali metal beam cells. Therefore, the bi-directional atom beam source 202 generates a first atom beam 208 in a beam path in the first detection region 204 along a −Z-axis direction and a second atom beam 210 in a beam path in the second detection region 206 along a +Z-axis direction, similar to as described above in the example of FIG. 4 with reference to the Cartesian coordinate system demonstrated at 162. The first and second atom beams 208 and 210 are thus directed in opposite directions with respect to each other, similar to as described above with respect to the example of FIG. 4.

The atom beam gyroscope system 200 also includes a first detection laser 214, a second detection laser 216, a first photodetector 218, and a second photodetector 220. Similar to as described above in the example of FIG. 4, the first detection laser 214 is configured to generate a first optical detection beam $O_{DET1}$ in the first detection region 204 and the second detection laser 216 is configured to generate a second optical detection beam $O_{DET2}$ in the second detection region 204. Thus, the intensity of the respective first and second optical detection beams $O_{DET1}'$ and $O_{DET2}'$ exiting the respective detection regions 204 and 206 can be measured via the first and second photodetectors 218 and 220. The first photodetector 218 can thus generate an intensity signal INT_1 that has a magnitude based on the intensity of the first optical detection beam $O_{DET1}'$ exiting the first detection region 204, and the second photodetector 170 can thus generate an intensity signal INT_2 that has a magnitude based on the intensity of the second optical detection beam $O_{DET2}'$ exiting the second detection region 206. Accordingly, the magnitude of the intensity signals INT_1 and INT_2 correspond to an amount of absorption of the photons of the first and second optical detection beams $O_{DET1}$ and $O_{DET2}$ by the alkali metal atoms of the respective atom beams 208 and 210.

As described above, the optical detection beams $O_{DET1}$ and $O_{DET2}$ can be tuned to a wavelength corresponding to a point on the absorption spectrum at a highest absolute-value slope. Thus, as the absorption of the photons of the optical detection beams $O_{DET1}$ and $O_{DET2}$ by the atom beams 208 and 210 can have a limited dynamic range based on a lack of linearity along the absorption spectrum as the alkali atoms increase in +/− axial velocity relative to the optical detection beams $O_{DET1}$ and $O_{DET2}$. Therefore, the atom beam gyroscope system 200 includes a first error generator 222 and a second error generator 224 configured to monitor a magnitude of the intensity signals INT_1 and INT_2 relative to a reference signal INT_REF. As an example, the reference signal INT_REF can have a magnitude that corresponds to an absorption intensity of the point on the absorption spectrum at a highest absolute-value slope. Thus, the first and second error generators 222 and 224 can generate respective error signals ERR_1 and ERR_2 corresponding to a difference between the intensity signals INT_1 and INT_2 relative to the reference signal INT_REF, such as resulting from the increase in +/− axial velocity relative to the optical detection beams $O_{DET1}$ and $O_{DET2}$. The error signals ERR_1 and ERR_2 can thus have magnitudes that vary linearly with the frequency offset along the absorption spectrum resulting from the change in intensity of the INT_1 and INT_2 relative to the reference signal INT_REF.

The error signals ERR_1 and ERR_2 are provided to each of the respective first and second detection lasers 214 and 216 to dynamically tune the first and second detection lasers 214 and 216. Specifically, because the error signals ERR_1 and ERR_2 have magnitudes that vary linearly with the frequency offset along the absorption spectrum, the error signals ERR_1 and ERR_2 can tune the respective first and second detection lasers 214 and 216 to a frequency corresponding to the point on the absorption spectrum at the highest absolute-value slope. Therefore, the absorption of the photons of the optical detection beams $O_{DET1}$ and $O_{DET2}$ by the atom beams 208 and 210 can have a substantially maximum dynamic range based on the frequency of the optical detection beams $O_{DET1}$ and $O_{DET2}$ being substantially fixed to the point on the absorption spectrum at the highest absolute-value slope, even during rotation of the atom beam gyroscope system 200 about the sensitive axis. It is to be understood that the tuning of the first and second detection lasers 214 and 216 could be based on the error signals ERR_1 and ERR_2 being provided to respective frequency shifting devices, such as acousto-optic modulators, in the examples of the detection lasers 214 and 216 having substantially fixed frequencies.

In addition, the error signals ERR_1 and ERR_2 are also provided to a gyroscope sensor 226, which can correspond to the gyroscope sensor 30 in the example of FIG. 1. Thus, the gyroscope sensor 226 can measure the rotation of the atom beam gyroscope system 200 about the sensitive axis based on the magnitudes of the error signals ERR_1 and ERR_2. As described above, the magnitudes of the error signals ERR_1 and ERR_2 vary linearly with the frequency offset along the absorption spectrum resulting from the change in intensity of the INT_1 and INT_2 relative to the reference signal INT_REF. As a result, the measurement of the rotation of the atom beam gyroscope system 200 about the sensitive axis can be performed with a substantially maximized sensitivity and linearity. Accordingly, the atom beam gyroscope system 200 can measure the rotation about the sensitive axis with a high degree of accuracy. It is to be understood that the inclusion of the first and second error generators 222 and 224 to calculate the rotation about the sensitive axis is not limited to use in a two atom beam system, such as the atom beam gyroscope system 200, but could instead also be included in a single atom beam gyroscope system, such as the atom beam gyroscope system 100 in the example of FIG. 3.

Figure 6:
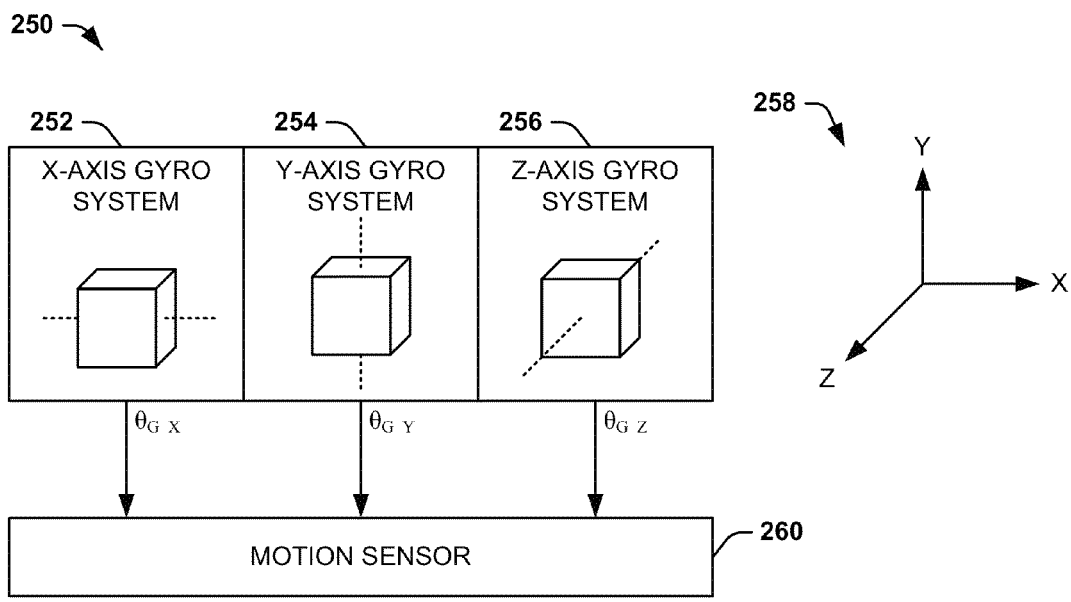
FIG. 6 illustrates an example of a three-axis gyroscope system in accordance with an aspect of the invention.

FIG. 6 illustrates an example of a three-axis gyroscope system 250 in accordance with an aspect of the invention. As an example, the three-axis gyroscope system 250 can be implemented in any of a variety of navigation control systems, such as for aircraft and/or spacecraft, or device to monitor yaw, pitch, and roll rotational motion information.

The three-axis gyroscope system 250 includes an X-axis gyroscope system 252, a Y-axis gyroscope system 254, and a Z-axis gyroscope system 256. As an example, each of the X-axis, Y-axis, and Z-axis gyroscope systems 252, 254, and 256 can be configured substantially similar to the atom beam gyroscope system 10 in the example of FIG. 1. In the example of FIG. 6, the X-axis gyroscope system 252 can have a sensitive axis about the X-axis, the Y-axis gyroscope system 254 can have a sensitive axis about the Y-axis, and the Z-axis gyroscope system 256 can have a sensitive axis about the Z-axis. The axes of rotation of the respective atom beam gyroscope systems 252, 254, and 256 are indicated in the example of FIG. 6 by a Cartesian coordinate system 258. Thus, each of the X-axis, Y-axis, and Z-axis gyroscope systems 252, 254, and 256 can be configured to calculate a rotation angle about the respective sensitive axes based on changes in measured optical energy absorption of alkali metal atoms in an atom beam resulting from a Doppler-shift in energy between absorbed photons and the alkali metal atoms due to an angular velocity of the alkali metal atoms. Accordingly, the three-axis gyroscope system 250 can measure rotational motion about all three of the sensitive axes demonstrated by the X-axis, Y-axis, and Z-axis gyroscope systems 252, 254, and 256.

In the example of FIG. 6, each of the X-axis, Y-axis, and Z-axis gyroscope systems 252, 254, and 256 are demonstrated as outputting signals that include the respective rotation angles $\theta_{G\_X}$, $\theta_{G\_Y}$, and $\theta_{G\_Z}$ to a motion sensor 260. The motion sensor 260 can thus be configured to determine an aggregate three-axis rotational motion of the associated vehicle or device that includes the three-axis gyroscope system 250. Therefore, the yaw, pitch, and roll of the associated vehicle or device that includes the three-axis gyroscope system 250 can be determined. Accordingly, the motion sensor 260 can be configured to display, output, and/or report the three-axis rotational motion of the associated vehicle or device that includes the three-axis gyroscope system 250.

Figure 7:
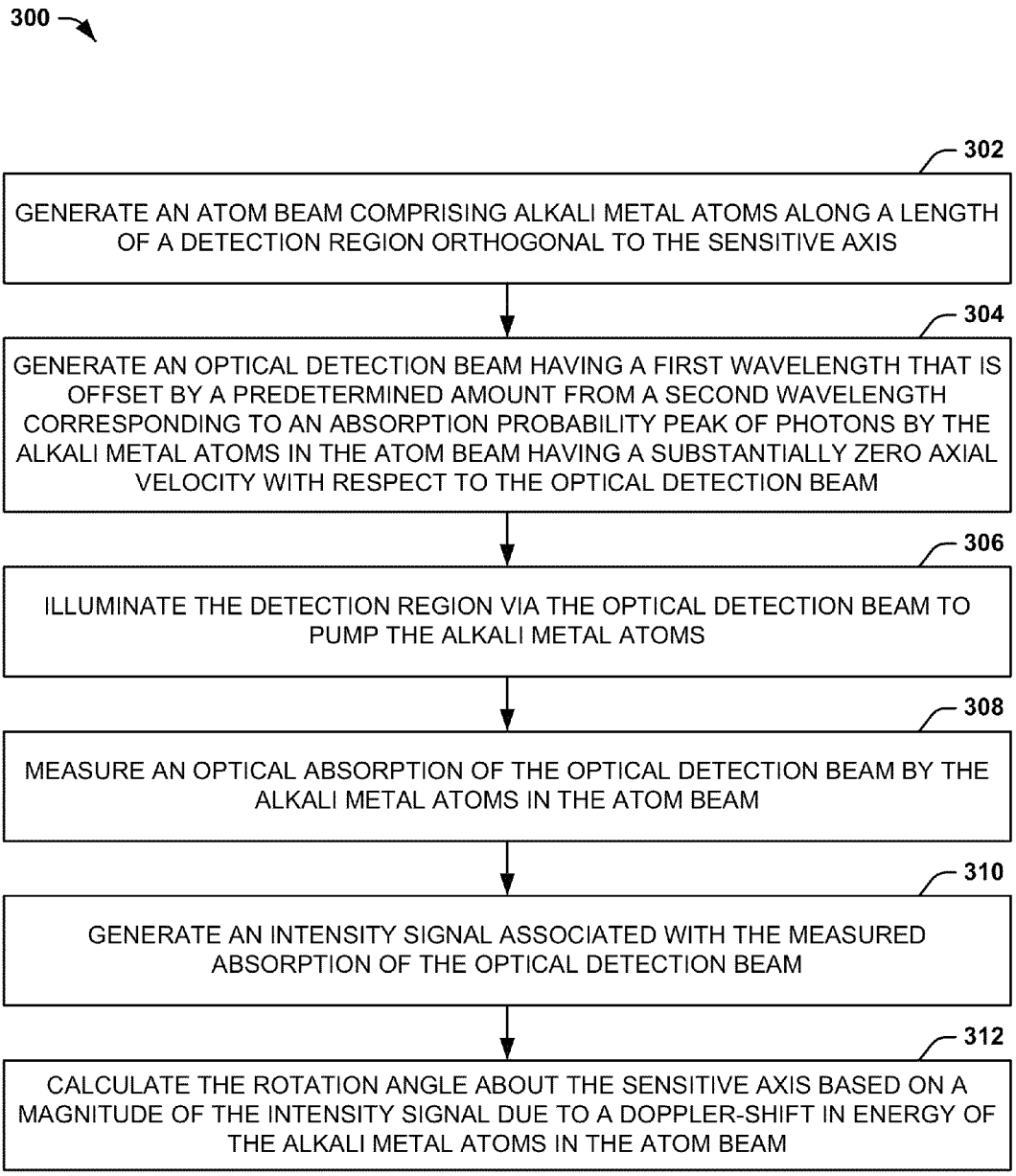
FIG. 7 illustrates an example of a method for calculating a rotation angle about a sensitive axis in accordance with an aspect of the invention.

In view of the foregoing structural and functional features described above, a methodology in accordance with various aspects of the present invention will be better appreciated with reference to FIG. 7. While, for purposes of simplicity of explanation, the methodologies of FIG. 7 are shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates an example of a method 300 for calculating a rotation angle about a sensitive axis. At 302, an atom beam comprising alkali metal atoms is generated along a length of a detection region orthogonal to the sensitive axis. The alkali metal atoms can be Rubidium (Rb) or Cesium (Cs). The atom beam can be generated by a variety of different kinds of atom beam sources, such as a two- or three-dimensional magneto-optical trap (MOT) or an evaporated alkali metal beam cell. At 304, an optical detection beam is generated having a first wavelength that is offset by a predetermined amount from a second wavelength corresponding to an absorption probability peak of photons by the alkali metal atoms in the atom beam having a substantially zero axial velocity with respect to the optical detection beam. The optical detection beam can be generated from a detection laser that is locked to the wavelength based on a Doppler-free absorption spectrometer. The detection laser can be optically split from the Doppler-free absorption spectrometer.

At 306, the detection region is illuminated via the optical detection beam to pump the alkali metal atoms. The optical detection beam can pass through the detection region in a direction that is orthogonal to both the sensitive axis and a nominal beam path of the atom beam. At 308, an optical absorption of the optical detection beam by the alkali metal atoms in the atom beam is measured. The optical absorption can be measured based on measuring an intensity of the optical detection beam exiting the detection region or by measuring fluorescence of photons being emitted from the alkali metal atoms. The absorption can be based not only on a Doppler-shift of the photons of the optical detection beam relative to the alkali metal atoms deviating from the nominal atom beam path, but also based on a Zeeman-shift resulting from a magnetic field gradient and circular-polarization of the optical detection beam.

At 310, an intensity signal associated with the measured absorption of the optical detection beam is generated. The intensity signal can have a magnitude associated with an intensity of the optical detection beam exiting the detection region, thus indicating absorption of the photons of the optical detection beam by the alkali metal atoms of the atom beam. The intensity signal can be one of two intensity signals from two separate optical detection beams for two atom beams directed in opposite directions. Thus, the two intensity signals can be implemented to determined and factor out linear acceleration of the atom beam gyroscope system. At 312, the rotation angle about the sensitive axis is calculated based on a magnitude of the intensity signal due to a Doppler-shift in energy of the alkali metal atoms in the atom beam. The Doppler-shift can result from an axial velocity of the alkali metal atoms relative to the optical detection beam resulting from rotation of the gyroscope system about the sensitive axis.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An atom beam gyroscope system comprising:
   an atom beam system configured to generate an atom beam comprising alkali metal atoms along a length of a detection region orthogonal to a sensitive axis;
   a detection system comprising a detection laser and a photodetector, the detection laser being configured to generate an optical detection beam that illuminates the detection region to pump the alkali metal atoms, and the photodetector being configured to measure an optical absorption of the optical detection beam by the alkali metal atoms in the atom beam and to generate an intensity signal associated with the measured optical absorption; and
   a gyroscope sensor configured to calculate rotation of the atom beam gyroscope system about the sensitive axis based on a magnitude of the intensity signal due to a Doppler-shift in energy of the alkali metal atoms in the atom beam.

2. The system of claim 1, wherein the atom beam system source comprises a Doppler-free absorption spectrometer configured to substantially stabilize a wavelength of the detection laser.

3. The system of claim 2, wherein the Doppler-free absorption spectrometer comprises:
   a first probe laser configured to generate a first optical probe beam through the alkali metal atoms;
   a pump laser configured to generate an optical pump beam that is substantially collinear with and propagates in an opposite direction of the first optical probe beam;
   a second probe laser configured to generate a second optical probe beam through the alkali metal atoms, the second optical probe beam being spaced apart from and substantially parallel with the first optical probe beam, the first and second optical probe beams propagating in the same direction; and
   a plurality of photodetectors configured to measure an intensity of the first and second optical probe beams and the optical pump beam, the wavelength of the detection laser being substantially stabilized based on a difference in the measured intensity of the first and second optical probe beams.

4. The system of claim 1, further comprising a magnetic field generator configured to generate a magnetic field gradient that increases from a nominal axis of the atom beam, and wherein the optical detection beam is circularly-polarized to substantially adjust a probability of absorption of photons of the optical detection beam by the alkali metal atoms in the atom beam having a non-zero axial velocity with respect to the optical detection beam.

5. The system of claim 1, wherein the detection laser is tuned to generate the optical detection beam at a first wavelength that is offset by a predetermined amount from a second wavelength corresponding to an absorption probability peak of photons by the alkali metal atoms in the atom beam having a substantially zero axial velocity with respect to the optical detection beam.

6. The system of claim 5, wherein the predetermined amount corresponds to a portion of the absorption probability peak having a greatest absolute value slope.

7. The system of claim 5, further comprising an error signal generator configured to generate an error signal having a magnitude that is based on a difference between a magnitude of the intensity signal and a reference signal, the error signal being implemented to dynamically tune the detection laser to maintain the optical detection beam at an absorption corresponding to the predetermined amount from the absorption probability peak.

8. The system of claim 7, wherein the gyroscope sensor is configured to calculate the rotation of the atom beam gyroscope system about the sensitive axis based on the magnitude of the error signal.

9. The system of claim 1, wherein the detection system comprises an accelerometer configured to detect and factor-out linear acceleration of the atom beam gyroscope system from detection of the rotation of the atom beam gyroscope system about the sensitive axis.

10. The system of claim 1, wherein the atom beam source comprises a first atom beam source configured to generate a first atom beam along a length of a first detection region and a second atom beam source configured to generate a second atom beam along a length of a second detection region, the first and second atom beams propagating orthogonal to the sensitive axis and in opposite directions relative to each other.

11. The system of claim 10, wherein the detection system is a first detection system associated with the first atom beam and comprises a first detection laser that generates a first optical detection beam and a first photodetector that generates a first intensity signal, the system further comprising a second detection system comprising a second detection laser and a second photodetector, the second detection laser being configured to generate a second optical detection beam that illuminates the second detection region to pump the alkali metal atoms of the second atom beam, and the second photodetector being configured to measure an optical absorption of the second optical detection beam by the alkali metal atoms in the second atom beam and to generate a second intensity signal associated with the measured optical absorption, wherein the detection system is configured to calculate linear acceleration of the atom beam gyroscope and rotation of the atom beam gyroscope system about the sensitive axis based on a magnitude of the first and second intensity signals.

12. The system of claim 1, wherein the atom beam source is configured as one of an evaporated alkali metal beam cell, a two-dimensional magneto-optical trap, and a three-dimensional magneto-optical trap.

13. A method for calculating a rotation angle about a sensitive axis, the method comprising:

generating an atom beam comprising alkali metal atoms along a length of a detection region orthogonal to the sensitive axis;

generating an optical detection beam having a first wavelength that is offset by a predetermined amount from a second wavelength corresponding to an absorption probability peak of photons by the alkali metal atoms in the atom beam having a substantially zero axial velocity with respect to the optical detection beam;

illuminating the detection region via the optical detection beam to pump the alkali metal atoms;

measuring an optical absorption of the optical detection beam by the alkali metal atoms in the atom beam;

generating an intensity signal associated with the measured absorption of the optical detection beam; and calculating the rotation angle about the sensitive axis based on a magnitude of the intensity signal due to a Doppler-shift in energy of the alkali metal atoms in the atom beam.

14. The method of claim 13, further comprising:
generating a magnetic field gradient that increases from a nominal axis of the atom beam; and
circularly-polarizing the optical detection beam to substantially adjust a probability of absorption of photons of the second optical probe beam by the alkali metal atoms in the atom beam having a non-zero axial velocity with respect to the second optical probe beam.

15. The method of claim 13, further comprising controlling a velocity of the atom beam to substantially mitigate gyroscope sensitivity scaling resulting from a linear acceleration in an axial direction substantially along the atom beam.

16. The method of claim 13, wherein the atom beam is a first atom beam, the detection region is a first detection region, the optical detection beam is a first optical detection beam, and the intensity signal is a first intensity signal, the method further comprising:
generating a second atom beam along a length of a second detection region, the first and second atom beams propagating orthogonal to the sensitive axis and in opposite directions relative to each other;
generating a second optical detection beam having the first wavelength;
illuminating the second detection region via the second optical detection beam to pump the alkali metal atoms of the second atom beam;
measuring an optical absorption of the second optical detection beam by the alkali metal atoms in the second atom beam;
generating a second intensity signal associated with the measured absorption of the second optical detection beam; and
calculating linear acceleration and rotation about the sensitive axis based on the first and second intensity signals.

17. The method of claim 13, further comprising tuning a wavelength of the optical detection beam based on a Doppler-free absorption spectrometer to the first wavelength that corresponds to a portion of the absorption probability peak having a greatest absolute value slope.

18. An atom beam gyroscope system comprising:
an atom beam system configured to generate a first atom beam along a length of a first detection region and a second atom beam along a length of a second detection region, the first and second atom beams comprising alkali metal atoms propagating orthogonal to the sensitive axis and in opposite directions relative to each other;
a detection system comprising a first detection laser, a second detection laser, a first photodetector, and a second photodetector, the first detection laser being configured to generate a first optical detection beam that illuminates the first detection region to pump the alkali metal atoms, the second detection laser being configured to generate a second optical detection beam that illuminates the second detection region to pump the alkali metal atoms, the first photodetector being configured to measure an intensity of the first optical detection beam exiting the first detection region and to generate a first intensity signal associated with the measured intensity, and the second photodetector being configured to measure an intensity of the second optical detection beam exiting the second detection region and to generate a second intensity signal associated with the measured intensity; and
a gyroscope sensor configured to calculate rotation and linear acceleration of the atom beam gyroscope system about the sensitive axis based on a magnitude of the first and second intensity signals due to a Doppler-shift in energy of the alkali metal atoms in the atom beam.

19. The system of claim 18, further comprising a magnetic field generator configured to generate a magnetic field gradient that increases from a nominal axis of the first and second atom beams, and wherein the first and second optical detection beams are circularly-polarized to substantially adjust a probability of absorption of photons of the first and second optical detection beams by the alkali metal atoms in the first and second atom beams having a non-zero axial velocity with respect to the first and second optical detection beams.

20. The system of claim 18, wherein the detection system comprises an accelerometer configured to detect and factor-out linear acceleration of the atom beam gyroscope system from detection of the rotation of the atom beam gyroscope system about the sensitive axis.

* * * * *